United States Patent [19]
Hakkarainen

[11] Patent Number: 5,699,012
[45] Date of Patent: Dec. 16, 1997

[54] HIGH GAIN, LOW OFFSET INPUT AMPLIFIER

[75] Inventor: Juka Mikko Hakkarainen, Coconut Grove, Fla.

[73] Assignee: General Electric Company, Schenectady, N.Y.

[21] Appl. No.: 608,394

[22] Filed: Feb. 28, 1996

[51] Int. Cl.$^6$ .................................................... H03F 3/45
[52] U.S. Cl. ................................................ 330/9; 330/69
[58] Field of Search .................................. 330/9, 69, 252, 330/260, 261

[56] References Cited

U.S. PATENT DOCUMENTS 5,095,282  3/1992  Dayton ........................... 330/69

Primary Examiner—Steven Mottola
Attorney, Agent, or Firm—Marvin Snyder

[57] ABSTRACT

An input signal buffer amplifier that has a high gain and a low offset voltage is implemented as an integrated circuit (IC) along with other components that perform further processing on an input signal. In one embodiment, the buffer amplifier includes first and second operational amplifiers (op amps). Voltage divider resistors R1 and R2 are connected in series between a positive voltage supply rail and a ground rail of the IC. The positive input terminal of the second op amp is electrically connected to a node between resistors R1 and R2. A feedback loop is established from the output of the second op amp to its negative terminal. The negative terminal of the first op amp is connected to a node between a series-connected input resistor and feedback resistor. The positive input terminal of the first op amp is connected to a node between series-connected voltage divider resistors R3 and R4 which are connected across the output of the second op amp and the ground rail. The first operational amplifier generates an output voltage signal VI+ and the second operational amplifier generates an output voltage signal VI−.

7 Claims, 2 Drawing Sheets

HIGH GAIN, LOW OFFSET INPUT AMPLIFIER

FIELD OF THE INVENTION

This invention relates generally to high gain, low offset input amplifiers and, more particularly, to high gain, low offset input amplifiers for accurate signal amplification.

BACKGROUND OF THE INVENTION

Input amplifiers often are used in integrated circuit (IC) processing so that the input signal is within the IC input signal range. Input signal amplification typically is performed using a single operational amplifier. Although an operational amplifier (op amp) generally performs suitable amplification, in some applications, such an op amp may inject an offset voltage into the input signal. The offset voltage adversely affects subsequent processing since the amplified signal is thus not an accurate representation of the actual input signal. In addition, if an op amp exhibits gain degradation, such degradation further adversely affects subsequent IC signal processing.

Offset voltages and gain degradation are especially troublesome if the input range of the IC includes the supply rail voltages. Particularly, most ICs include positive and negative supply rail voltages. Such voltages are used by the IC components as reference signals, e.g., for comparators and for power supplies. If the amplified input signal should ideally have a value equal to a supply rail voltage but actually has a value not equal to the supply rail voltage, erroneous results clearly will be obtained from the IC.

Attempts to compensate for any offset voltages and gain degradation introduced into an input signal by an input amplifier include using trimming components. Such trimming components often are implemented on the IC and trim, or clip, the input signal to be within the IC operating range. Although trimming components typically improves processing results, use of trimming components increases manufacturing complexity and consequently the IC manufacturing costs. Especially if a particular IC is manufactured in high volumes, use of trimming components can be expensive. Also, in applications that require highly accurate input signal processing, use of trimming components is not attractive since at least some data represented in the original input signal are lost as a result of trimming.

It would be desirable, therefore, to provide a high gain, low offset input signal amplifier so that more accurate signal processing can be performed, even by an IC having an input range that includes the negative or positive supply rail voltages, or both. It also would be desirable to provide such a high gain, low offset input signal amplifier that does not require any on-chip trimming components so that the IC costs are not increased.

SUMMARY OF THE INVENTION

These and other desiderata may be attained by an input signal amplifier which includes first and second operational amplifiers (op amps). The subject input signal amplifier, in one embodiment, may be implemented as part of an integrated circuit (IC) along with the other signal processing components which perform further signal processing. In accordance with the one embodiment of the input signal amplifier, voltage divider resistors are connected in series between the positive voltage supply rail and the ground rail of the IC. The negative input terminal of the second op amp is electrically connected to a node between the resistors. A feedback loop is established from the output of the second op amp to its negative terminal. The second operational amplifier generates an output voltage signal VI−.

The negative terminal of the first op amp is connected to a node in series with an input resistor and a feedback resistor. The positive terminal of the first op amp is connected to a node in series with the voltage divider resistors connected in series between the output of the second op amp and the ground rail. The first operational amplifier generates an output voltage signal VI+.

Output signal VI+ from the first op amp is an inverted, low offset and high gain signal representative of the input signal Vin. Such a low offset, high gain output signal VI+ enables more accurate signal processing, including even by IC or external components having an input range that includes the supply rail voltages. In addition, no on-chip trimming components are required.

BRIEF DESCRIPTION OF THE DRAWINGS

The features of the invention believed to be novel are set forth in the appended claims. The invention, however, together with further objects and advantages thereof, may best be understood by reference to the following description taken in conjunction with the accompanying drawing(s) in which:

DETAILED DESCRIPTION OF THE DRAWINGS

Figure 1A:
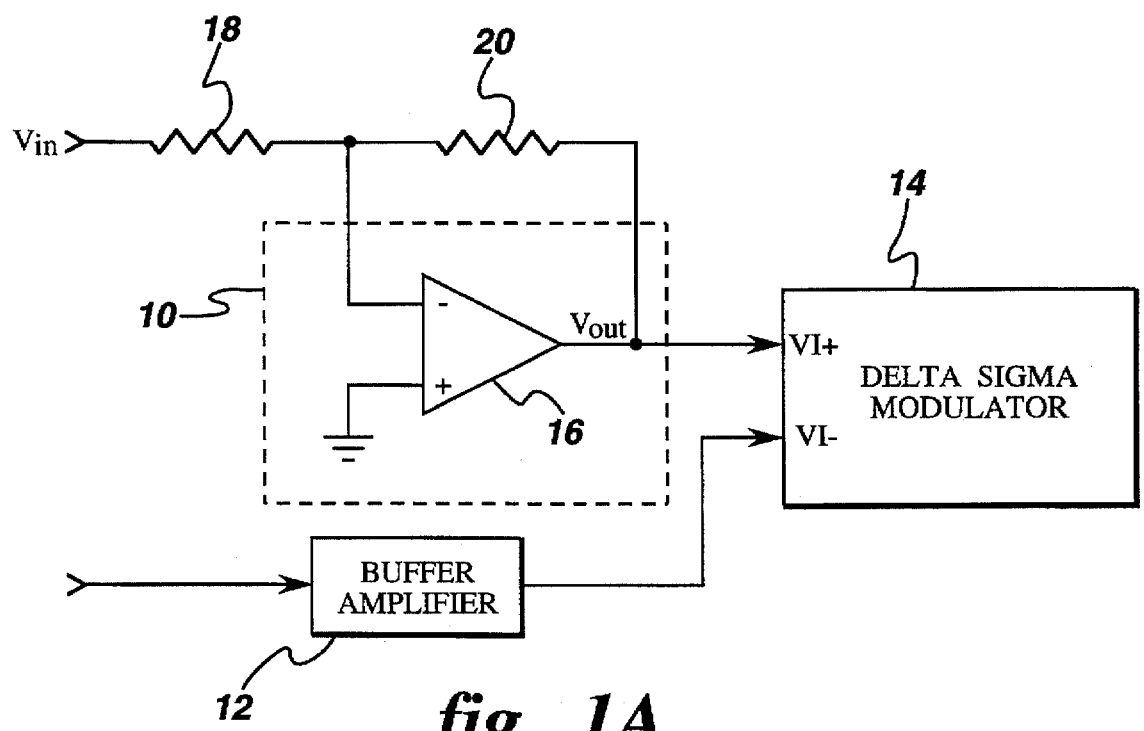
FIG. 1A is a circuit schematic diagram of known input signal buffer amplifiers connected to an integrated circuit.

FIG. 1A is a circuit schematic diagram of known input signal buffer amplifiers 10 and 12 connected to an integrated circuit, illustrated as a delta sigma modulator 14. Amplifiers 10 and 12 are identical and therefore, only amplifier 10 is illustrated in detail in FIG. 1A. Amplifier 10 includes an operational amplifier (op amp) 16. The positive terminal of op amp 16 is connected to ground. The negative terminal of op amp 16 is electrically connected between an input resistor 18 and a feedback resistor 20. Input resistor 18 is connected to receive an input voltage Vin. Feedback resistor 20 is connected to the output of op amp 16. The output of op amp 16 also is supplied to input terminal VI+ of modulator 14.

Figure 1B:
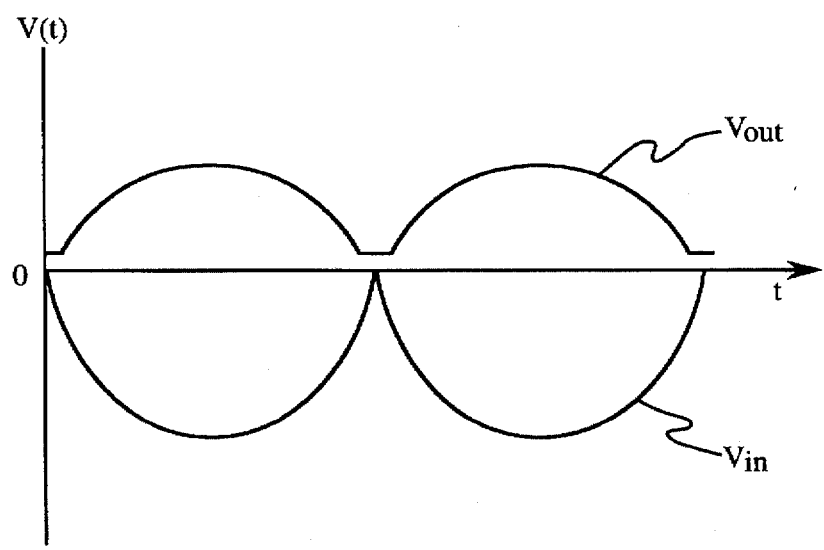
FIG. 1B is a voltage-time diagram illustrating input voltage Vin and expected voltage Vout of one buffer amplifier shown in FIG. 1A.

FIG. 1B is a voltage-time diagram illustrating input voltage Vin and an expected output signal Vout (or VI+) from op amp 16. As shown in FIG. 1B, input signal Vin is a negative half-sinusoid signal. Signal Vout is inverted with respect to Vin, as desired. Signal Vout, however, includes both an offset and gain degradation which are most noticeable when the magnitude of Vin, and therefore Vout, are near the negative supply rail (ground). As explained above, such offset and gain degradation are particularly troublesome when high accuracy signal processing, such as delta sigma modulation, is to be performed on the input signal.

Figure 2A:
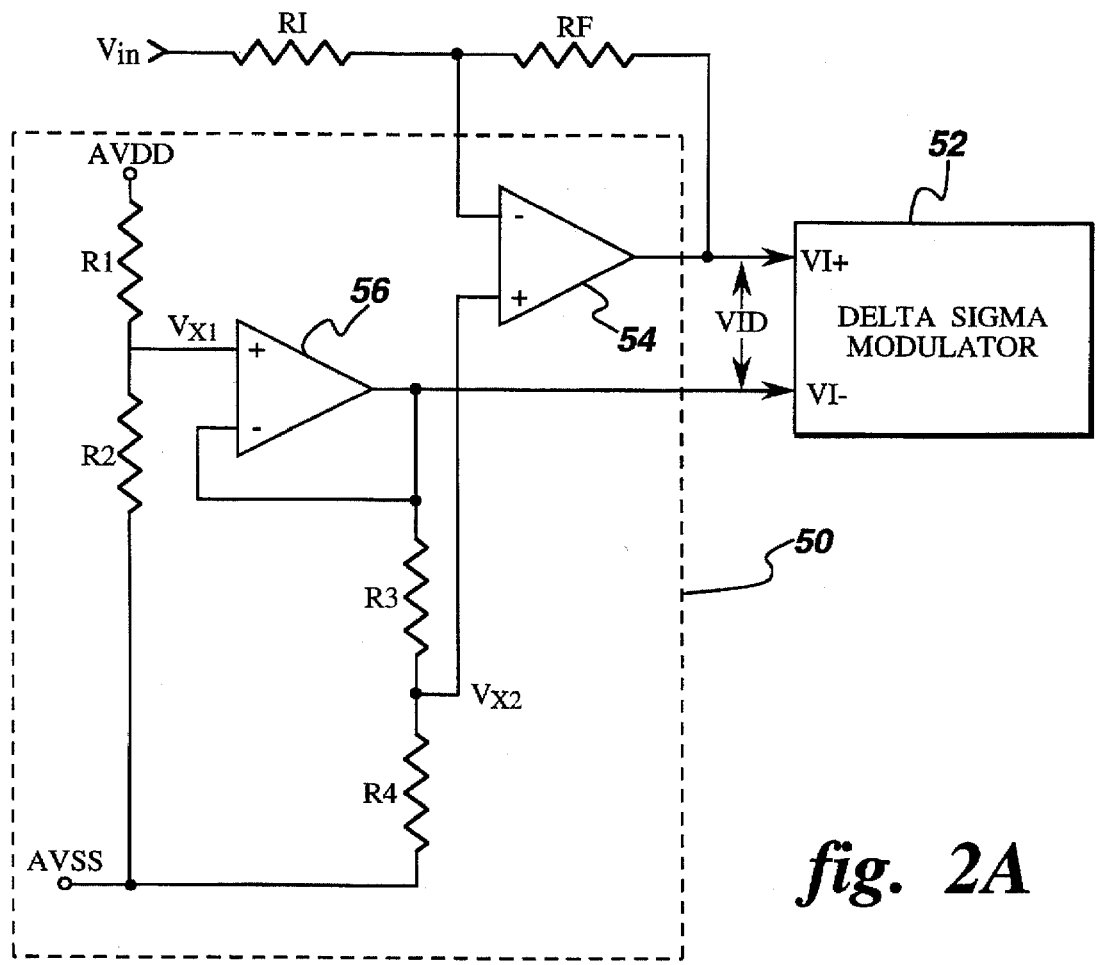
FIG. 2A is a circuit schematic diagram of an input signal buffer amplifier connected to an integrated circuit in accordance with one embodiment of the present invention.

FIG. 2A is a circuit schematic diagram of an input signal buffer amplifier 50 connected to an integrated circuit, illustrated as a delta sigma modulator 52, in accordance with one embodiment of the present invention. Amplifier 50 and modulator 52, as shown in FIG. 2A, are implemented on one IC. Amplifier 50 includes op amps 54 and 56. Voltage divider resistors R1 and R2 are connected in series between positive voltage supply rail AVDD and ground rail AVSS of the IC. The positive input terminal of op amp 56 is electrically connected between resistors R1 and R2. A feedback loop is connected from the output of op amp 56 to the negative terminal of op amp 56. The output of op amp 56 also is connected to the negative voltage input VI– of modulator 52.

With respect to op amp 54, the negative terminal is connected between an input resistor RI and a feedback resistor RF. The positive terminal of op amp 54 is connected between voltage divider resistors R3 and R4 connected in series between the output of op amp 56 and ground rail AVSS. The output of op amp 54 is connected to the positive voltage input VI+ of modulator 52.

Figure 2B:
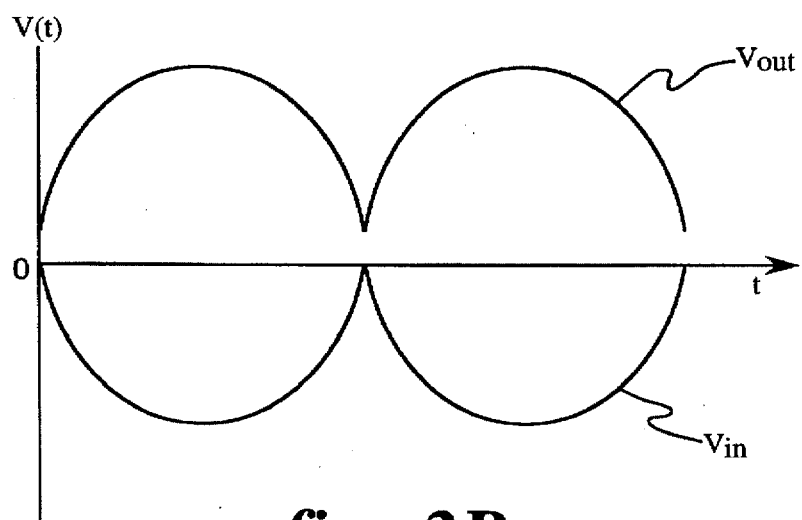
FIG. 2B is a voltage-time diagram illustrating input voltage Vin and expected voltage Vout of the input signal buffer amplifier shown in FIG. 2A.

FIG. 2B is a voltage-time diagram illustrating input voltage Vin and the expected output voltage Vout (or VI+) from op amp 54 of input signal buffer amplifier 50 shown in FIG. 2A. As illustrated in FIG. 2B, there is no offset and no gain degradation in a difference voltage, i.e., (VI+)–(VI–), at modulator 52.

With respect to operation of amplifier 50, voltage input VI– is slightly above the voltage magnitude of ground rail AVSS. Therefore, op amp 54 does not need to drive its output signal Vout down to the same voltage magnitude as that of the ground rail AVSS. As a result, modulator 52 is inherently insensitive to any offset introduced by op amp 56. Any offset introduced by op amp 54 may be removed by chopper stabilization.

Op amp 56 creates a bias for both the delta-sigma modulator VI-input as well as for op amp 54 which inverts and scales input voltage Vin. The maximum amplitude of Vin is –5V. The following voltages are developed in amplifier 50:

$$V_{X1} = \frac{R_2}{R_1 + R_2} \cdot AVDD \quad (1)$$

(where AVDD is the voltage of the positive voltage supply rail AVDD)

$$VI- = \frac{R_2}{R_1 + R_2} \cdot AVDD + V_{OS1} \quad (2)$$

(where $V_{os1}$ represents the offset voltage of op amp 56)

$$V_{X2} = \left(\frac{R_4}{R_3 + R_4}\right)\left(\frac{R_2}{R_1 + R_2} \cdot AVDD + V_{OS1}\right) \quad (3)$$

$$VI+ = -\frac{R_F}{R_I} \cdot V_{IN} + \quad (4)$$

$$\left(\frac{R_1 + R_F}{R_I}\right)\left(\frac{R_4}{R_3 + R_4}\right)\left(\frac{R_2}{R_1 + R_2} \cdot AVDD + V_{OS1}\right)$$

Thus, the input voltage to modulator 52 (VID=[VI+]–[VI–]) is:

$$VID = -\frac{R_F}{R_I} \cdot V_{IN} + \quad (5)$$

$$\left(\left[\frac{R_2}{R_1 + R_2} \cdot AVDD + V_{OS1}\right]\left[\left(\frac{R_1 + R_F}{R_I}\right)\left(\frac{R_4}{R_3 + R_4}\right) - 1\right]\right)$$

Therefore, if:

$$\frac{R_I + R_F}{R_I} \cdot \frac{R_4}{R_3 + R_4} = 1 \quad (6)$$

then voltage VID is desired to be:

$$VID = \frac{R_F}{R_I} \cdot V_{IN} \quad (7)$$

Any mismatch in the ratio set forth in Equation 6 causes an offset term to leak into VID. By choosing $R_1$ and $R_2$ in Equation 1 such that $R_2/(R_1+R_2)=2/100$, then, with voltage AVDD=5V, $V_{X1}$=100 mV. Typically $V_{X1} \gg V_{OS1}$. For Example, a 1% error in the ratio set forth in Equation 6 causes the offset term in VID to be about 100 mV·0.01=1 mV.

Many variations of buffer amplifier 50 described above are possible. For example, op amp 54 is connected to operate in an inverting mode. Op amp 54 could alternatively be connected to operate in a noninverting mode. Furthermore, buffer amplifier 50 is connected to buffer the voltage of ground rail AVSS. Buffer amplifier 50 could alternatively be connected to buffer the voltage of positive supply rail AVDD.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. An input signal amplifier comprising:

a first operational amplifier;

a biasing amplifier comprising a second operational amplifier;

first and second voltage divider resistors coupled in series for connection across a DC bias voltage, a first input terminal of said second operational amplifier coupled to a first node between said first and second voltage divider resistors;

a feedback loop coupling an output of said second operational amplifier to a second input terminal of said second operational amplifier;

third and fourth voltage divider resistors coupled in series, said third resistor being coupled to said output of said second operational amplifier, a first input terminal of said first operational amplifier coupled to a second node between said third and fourth voltage divider resistors for receiving a fixed bias voltage; and a second input terminal of said first operational amplifier coupled to receive an input signal and, in response thereto, to generate an output signal Vout.

2. The input signal amplifier recited in claim 1 including a feedback resistor coupling an output of said first operational amplifier to the second input terminal of said first operational amplifier.

3. The input signal amplifier recited in claim 2 including an input resistor coupled to the second input terminal of said first operational amplifier.

4. The input signal amplifier recited in claim 3 wherein:

$$V_{X1} = \frac{R_2}{R_1 + R_2} \cdot AVDD,$$

-continued $$VI- = \frac{R_2}{R_1+R_2} \cdot AVDD + V_{OSP}$$

$$V_{X2} = \left(\frac{R_4}{R_3+R_4}\right)\left(\frac{R_2}{R_1+R_2} \cdot AVDD + V_{OS1}\right)$$

$$VI+ = -\frac{R_F}{R_I} \cdot V_{IN} +$$

$$\left(\frac{R_1+R_F}{R_I}\right)\left(\frac{R_4}{R_3+R_4}\right)\left(\frac{R_2}{R_1+R_2} \cdot AVDD + V_{OS1}\right)$$

where $V_{X1}$ is a voltage signal applied to the first input terminal of said second operational amplifier, VI– is a voltage signal produced by said second operational amplifier, $V_{X2}$ is a voltage signal applied to the first input terminal of said first operational amplifier, VI+ is the voltage signal Vout produced by said first operational amplifier, $R_1$ and $R_2$ are the resistance values of said first and second voltage divider resistors, respectively, $R_3$ and $R_4$ are the resistance values of said third and fourth voltage divider resistors, respectively, $R_I$ is the resistance value of said input resistor, $V_{IN}$ is an input voltage applied to the input resistor, $R_F$ is the resistance value of said feedback resistor, $V_{OS1}$ is an offset voltage of said second operational amplifier, and AVDD is the voltage across the first and second voltage divider resistors.

5. An input signal amplifier for amplifying an input signal $V_{IN}$ to provide an output signal VID, said input signal amplifier comprising:

a first operational amplifier configured to produce a first output voltage signal VI+;

a second operational amplifier configured to produce a second output voltage signal VI–;

said output signal VID comprising the difference between the absolute values of VI+ and VI– and being equal to:

$$VID = \frac{R_F}{R_I} \cdot V_{IN};$$

first and second voltage divider resistors coupled in series, a first input terminal of said second operational amplifier coupled to a first node between said first and second voltage divider resistors;

third and fourth voltage divider resistors coupled in series, said third resistor being coupled to an output of said second operational amplifier, a first input terminal of said first operational amplifier coupled to a second node between said third and fourth voltage divider resistors;

a feedback resistor having a resistance $R_F$ coupled between an output of said first operational amplifier and a second input terminal of said first operational amplifier;

an input resistor having a resistance $R_I$, said feedback resistor $R_F$ being coupled in series with said input resistor having a resistance $R_I$; and a second input terminal of said first operational amplifier coupled to receive a voltage signal and, in response thereto, to generate said first output signal VI+.

6. The input signal amplifier recited in claim 5 including a feedback loop coupling an output of said second operational amplifier to a second terminal of said second operational amplifier.

7. The input signal amplifier recited in claim 6 wherein:

$$V_{X1} = \frac{R_2}{R_1+R_2} \cdot AVDD,$$

$$VI- = \frac{R_2}{R_1+R_2} \cdot AVDD + V_{OSP}$$

$$V_{X2} = \left(\frac{R_4}{R_3+R_4}\right)\left(\frac{R_2}{R_1+R_2} \cdot AVDD + V_{OS1}\right)$$

$$VI+ = -\frac{R_F}{R_I} \cdot V_{IN} +$$

$$\left(\frac{R_1+R_F}{R_I}\right)\left(\frac{R_4}{R_3+R_4}\right)\left(\frac{R_2}{R_1+R_2} \cdot AVDD + V_{OS1}\right)$$

where $V_{X1}$ is a voltage signal applied to the first input terminal of said second operational amplifier, $V_{X2}$ is a voltage signal applied to the first input terminal of said first operational amplifier, $R_1$ and $R_2$ are resistance values of said first and second voltage divider resistors, respectively, $R_3$ and $R_4$ are resistance values of said third and fourth voltage divider resistors, respectively, $V_{OS1}$ is an offset voltage of said second operational amplifier, and AVDD is the voltage across the first and second voltage divider resistors.

* * * * *